United States Patent [19]

Shaw et al.

[11] 4,064,522
[45] Dec. 20, 1977

[54] HIGH EFFICIENCY SELENIUM HETEROJUNCTION SOLAR CELLS

[75] Inventors: Robert F. Shaw, Chatham; Amal K. Ghosh, New Providence, both of N.J.

[73] Assignee: Exxon Research & Engineering Co., Linden, N.J.

[21] Appl. No.: 655,079

[22] Filed: Feb. 4, 1976

[51] Int. Cl.² .................. H01L 29/161; H01L 27/14
[52] U.S. Cl. .................................... 357/16; 357/30; 357/2; 357/4; 357/11
[58] Field of Search .............. 357/16, 30, 2, 4, 11, 357/31, 10

[56] References Cited

U.S. PATENT DOCUMENTS

| | | | |
|---|---|---|---|
| 3,556,787 | 1/1971 | Letter | 96/1.8 |
| 3,622,712 | 11/1971 | Moore | 179/100 |
| 3,922,774 | 12/1975 | Lindmayer | 29/572 |
| 3,966,512 | 6/1976 | Nonaka | 148/174 |

*Primary Examiner*—Martin H. Edlow
*Attorney, Agent, or Firm*—Joseph J. Dvorak

[57] ABSTRACT

A photocell includes a metallic base electrode, a continuous, crystalline P-type semiconductive selenium layer less than about 50 microns thick, a thin tellurium layer interposed therebetween to metallurgically bond the base electrode to the selenium layer and to form an ohmic contact between the base electrode and the selenium layer, a thin N-type semiconductive cadmium selenide layer contiguous with the selenium layer and forming a photovoltaic heterojunction therebetween, a pellucid layer of at least one cadmium chalcogenide contiguous with the cadmium selenide layer and forming an ohmic contact therewith and a current collecting electrode on the cadmium chalcogenide layer. The sunlight conversion efficiency of the cell is at least about 3.0%. The efficiency can be further improved by doping the selenium layer to improve its conductivity and by providing an N-type layer of cadmium selenide and N+cadmium oxide. This can be done by continuously varying the oxygen content of the N-type layer. It is further helpful if a counterelectrode in the form of a grid is added, which minimizes both the resistance between the grid members in the cadmium layer and the blockage of light by the grid.

8 Claims, 1 Drawing Figure

U.S. Patent  Dec. 20, 1977  4,064,522
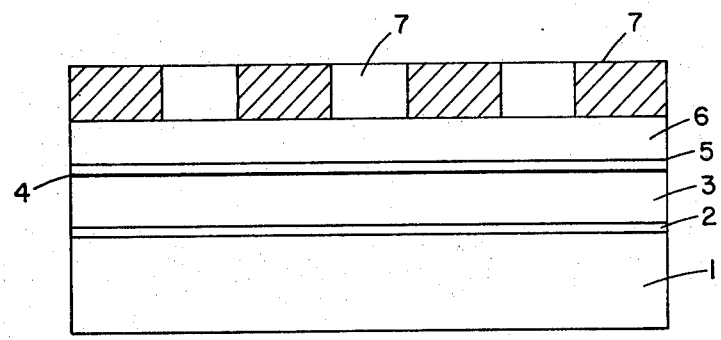

HIGH EFFICIENCY SELENIUM HETEROJUNCTION SOLAR CELLS

BACKGROUND OF THE INVENTION

The present invention relates to photovoltaic cells and more particularly to selenium photovoltaic cells having higher quantum efficiencies.

Known selenium photovoltaic cells comprise a base electrode, a crystalline selenium P-type semiconductive layer, an N-type semiconductive layer, a heterojunction between the two semiconductive layers and a current collecting electrode consisting of an N+ electrode and a metal grid for collecting current while permitting light to impinge and to be adsorbed by the N-type layer, P-type layer and the junction and to generate ultimately an electric current. Most selenium photovoltaic cells of the type described have sunlight conversion efficiencies of about 1% or less. Based on band gap of the material and assuming 100 percent collection efficiency, the estimate of sunlight conversion efficiencies varies between 10-20%. But, taking into account other realistic factors involving collection efficiencies, the experimental value of 1% has been said to be all that can be expected for these cells.

BRIEF SUMMARY OF THE INVENTION

Generally speaking, the present invention relates to an improved selenium photovoltaic device. The device comprises a metallic base electrode, a continuous, crystalline P-type semiconductive selenium layer, a thin tellurium layer interposed between the base electrode and the selenium layer to provide a metallurgical bond between the base electrode and the selenium layer and to provide an ohmic contact therebetween, a thin N-type semiconductive cadmium selenide layer contiguous with the selenium layer and forming a photovoltaic heterojunction therebetween, a pellucid layer of at least one cadmium chalcogenide contiguous with the cadmium selenide layer and forming an ohmic contact therewith and a metallic current collecting electrode on the cadmium chalcogenide layer.

DESCRIPTION OF THE DRAWING

The present invention may be better understood with reference to the attached drawing in which the FIGURE represents a cross-sectional view of the photovoltaic device in accordance with the present invention.

DETAILED DESCRIPTON

The present invention relates to selenium photovoltaic devices having sunlight conversion efficiencies far in excess of commercially available selenium photovoltaic devices. The selenium photovoltaic devices comprise a metallic base electrode, a continuous, crystalline, P-type semi-conductive selenium layer having a thickness less than about 50 microns, a thin tellurium layer interposed between the base electrode and the selenium layer to provide a metallurgical bond therebetween and to provide an ohmic contact between the base electrode and the selenium layer, a thin N-type semiconductive cadmium selenide layer contiguous with the selenium layer and forming a photovoltaic heterojunction therebetween, the pellucid layer of at least one cadmium chalcogenide contiguous with the cadmium selenide layer and forming an ohmic contact therewith and a current collecting electrode on the cadmium chalcogenide layer. The efficiency of the photovoltaic device can be improved by (1) doping the P-type selenium layer with acceptor impurities to lower the resistivity of the P-type layer, (2) by reducing the thickness of the selenium layer, (3) employing as the N-type layer a mixture of cadmium selenide and cadmium oxide with the oxygen content continuously increasing the heterojunction to about 50 atomic % at the outer surface of the cadmium chalcogenide layer to form a highly conductive N+ layer to minimize internal resistance losses, and (4) specially designing the current collecting electrode to minimize simultaneously the effective resistance of the cadmium oxide and the amount of light blocked out by the current collector.

In the FIGURE, there is shown a photovoltaic device of a preferred embodiment of the present invention. As shown, the structure comprises a base electrode 1, a continuous, crystalline, P-type semiconductive selenium layer 3, a thin tellurium layer 2 which metallurgically bonds selenium layer 3 to base electrode 1 and to form an ohmic contact therebetween, a thin N-type semiconductive cadmium selenide layer 5 which forms photovoltaic heterojunction 4 with layer 3, a pellucid N-type, preferably $N^{30}$ type, semiconductive layer 6 of at least one cadmium chalcogenide, and a current collecting metallic electrode 7 for collecting current generated by the photovoltaic device.

Base electrode 1 can be made of any metal that displays adequate conductivity and which has a low diffusivity in and reactivity with selenium. Among the metals which can be used are the iron-group metals including iron, nickel, cobalt, and alloys thereof, and aluminum and its alloys. Metals such as copper which have high diffusivities in and reactivities with selenium should not be used as the base electrode.

P-type semiconductive selenium layer 3 is thin, continuous and crystalline. Layer 3 is advantageously as thin as possible without disrupting the continuity of the selenium layer so that the series resistance of the layer is minimized. Continuity of layer 3 is essential to protect against short circuiting between the P- and N-type layers so that the cell can produce a useful electrical potential. Crystallinity of the selenium layer is necessary if the selenium layer is to generate current collectors from incident light. The selenium layer is advantageously less than about 50 microns, advantageously between about 3 microns and 20 microns thick. The sunlight efficiency of the cell can be increased to about 3% for cells having selenium layer thicknesses within the foregoing ranges compared to efficiencies of less than about 1% for cells having selenium layers greater than about 100 microns. The sunlight efficiency of the selenium cells can also be improved by doping the selenium layer with acceptor-type impurities to lower further the series resistance of the selenium layer. For example, the selenium layer can be doped with at least one element selected from the group consisting of chlorine, tellurium, thallium and mercury in small but effective amounts to alter the resistance of the selenium layer and in amounts less than about 20,000 parts per million so that the electric potential of the cell is not lowered.

An important feature of the present invention is the use of a thin tellurium layer 2 to provide a metallurgical bond and to provide an ohmic contact between base electrode 1 and selenium layer 3. The good metallurgical bond between the base electrode and the selenium layer made possible by the tellurium layer eliminates the need to roughen the surface of the base electrode that is to be coated with the selenium layer to form a mechanical bond and thereby reduces the thickness of the selenium layer that must be used to insure the continuity of the selenium layer. Another advantage of the intermediate tellurium layer is that it promotes the formation of an ohmic contact. The production of the ohmic contact rather than a barrier layer further increases the efficiency of the cell. Elimination of the barrier between the base electrode and the selenium can substantially increase cell efficiency. The tellurium layer is sufficiently thick to promote metallurgical bonding and to produce an ohmic contact and to promote fine grain crystallization of the selenium. The foregoing advantages are realized if the tellurium layer is at least about 50 Angstroms (A) and advantageously less than about 10,000 A; most advantageously the tellurium layer is between about 200 A and 1000 A.

Contiguous with the P-type selenium layer is an N-type semiconductive cadmium selenide layer which forms a photovoltaic heterojunction with the selenium layer. Cadmium selenide and selenium have forbidden energy gaps that are compatible in forming heterojunctions which are useful in converting sunlight into electrical energy. The cadmium selenide layer is less than about 1000 A, advantageously less than about 500 A and most advantageously less than 300 A thick. Cadmium selenide layers that are much thicker become opaque and render the cell less efficient inasmuch as most of the current carriers generated by the sunlight are generated in the selenium layer.

The N-type cadmium chalcogenide semiconductive layer is thin and conductive. The cadmium chalcogenide layer is sufficiently thick to insure proper current collection but sufficiently thin to transmit the maximum amount of incidental light to the heterojunction, i.e. the layer is pellucid, where maximum current carrier generation occurs. The cadmium chalcogenide layer is at least about 20 A, and less than about 1000 A thick, and advantageously between about 50 and 500 A. The efficiency of the cell can be significantly improved if the cadmium chalcogenide layer has an oxygen content that continuously increases from the cadmium selenide layer to about 50 atomic percent at the outer surface of the cadmium chalcogenide layer. Cadmium selenide displays high carrier concentrations and carrier mobility, both of which are desirable properties in the vicinity of the heterojunction because these properties determine the current generating capabilities of the cell. Cadmium oxide, on the other hand, can be made to be highly conductive (i.e. the cadmium oxide can be characterized as an N+ semiconductive layer) and has a comparatively high transmissivity when used in thin films so that the low resistance and the higher light transmission to the vicinity of the heterojunction where electrons and holes (the current carriers) are generated and where such generation is most effective in producing useful current.

Current is collected from the cell by a metallic electrode advantageously in the shape of a metallic grid. The design of the metallic grid can influence the efficiency of the photovoltaic cell. Advantageously, the grid is in the form of fingers connected by a cross member that collects the current from the individual fingers. Such an arrangement insures that less than about 20% of the surface is covered by the metallic grid which maximizes the area for light adsorption while minimizing the electrical resistance inherently encountered in the current collection process.

The photovoltaic cells in accordance with the present invention are produced by a series of steps, many of which are well known in the art. The surface of the base electrode to be coated with the selenium is treated either mechanically or chemically to remove any oxide coating or other surface contamination to improve the metallurgical bond between the base electrode and the selenium layer. Examples of mechanical cleaning include sanding, sandblasting, and polishing while the chemical methods include pickling with hydrochloric acid, sulfuric acid, and other etchants well known in the art. After cleaning, a thin tellurium layer is evaporated on the cleaned base electrode surface. Fused selenium is spread over the tellurium coated base electrode to provide a selenium layer between about 3 and 50 microns. The selenium coated base electrode is then rapidly cooled to a temperature below about 100° C. Thereafter, the base electrode with the solidified amorphous selenium is heated to a temperature between about 80° and 130° C to nucleate the selenium and then the coated base electrode is heated to a temperature between about 110° and 170° C to complete crystallization. The base electrode containing the crystallized selenium layer is then placed in sputtering apparatus which contains a cadmium cathode, and the N-type cadmium chalcogenide layer is sputtered on the selenium layer in air or other oxygen-nitrogen gas mixtures to produce the cadmium-selenide layer which forms the heterojunction with the selenium and to form the cadmium oxide N+ layer. The counterelectrode is then applied to the cadmium oxide layer. The current collecting electrode can be applied by masking and vapor deposition or by masking and painting.

In order to give those skilled in the art a better understanding of the present invention, the following illustrative examples are given:

EXAMPLE 1

A semi-polished iron substrate, previously coated with 500 Angstroms of tellurium, was heated to 250° C. Elemental selenium was fused on the substrate and then allowed to cool to 185° C. The selenium was then spread with a doctor blade to form a uniform film and cooled to 120° C for 3 minutes. The temperature was then raised to 150° C which effected complete crystallization of the selenium. The P-type selenium layer so formed had a thickness of eight microns.

Cadmium selenide and cadmium oxide layers were formed in one process step by reactively sputtering cadmium metal in a 60/40 nitrogen/oxygen gas mixture at a pressure of ten microns of mercury for eighteen minutes at a radio frequency power density of 0.5 watt/cm$^2$. Under these conditions, a thin N-type cadmium selenide layer contiguous with the selenium layer and forming a heterojunction was deposited and thereafter with continuing deposition an N+ type layer was formed. The combined N and N+ layers were about 1500° A thick, sufficiently thin to maximize transmission of incident sunlight to the heterojunction.

The gold current collecting electrode was then deposited using standard photoresist masking techniques.

This photovoltaic cell had an open circuit voltage of 0.74 volt, a short circuit current of eight milliamperes with a sunlight irradiance of 95 milliwatts/cm$^2$ and an efficiency of 3.01%.

EXAMPLE 2

A photovoltaic cell was prepared exactly as in Example 1 except the iron had no tellurium layer and was heavily acid etched to effect good adherence of the selenium layer. In this example, the selenium layer thickness had to be greater than 15 microns.

The photovoltaic cell gave an open circuit voltage of only 0.52 volt and a short circuit current of six milliamperes, demonstrating the combined effects of the non-ohmic contact between the selenium and iron substrate and the thicker selenium layer required to provide good adherence to the base electrode in the absence of the intermediate tellurium layer.

EXAMPLE 3

A photovoltaic cell was prepared exactly as in Example 1 except instead of the sputtered cadmium selenide/cadmium oxide layer a single layer of 200 Angstroms of evaporated cadmium selenide was used.

The open circuit voltage was 0.62 volt; however, the short circuit current was only 1.1 milliamperes, demonstrating the necessity for the cadmium oxide N+ layer.

What is claimed is:

1. A photovoltaic device which comprises a metallic base electrode; a continuous, crystalline P-type semiconductive selenium layer; a thin tellurium layer interposed between the base electrode and the selenium layer to provide a metallurgical bond between the base electrode and the selenium layer and to provide an ohmic contact therebetween; a thin N-type semiconductive cadmium selenide layer contiguous with the selenium layer and forming a photovoltaic heterojunction therebetween; a pellucid layer of cadmium oxide contiguous with the cadmium selenide layer and forming an ohmic contact therebetween and a metallic current collecting electrode on the cadmium chalcogenide layer.

2. The photovoltaic cell described in claim 1 wherein the P-type selenium layer is doped with at least one dopant selected from the group consisting of chlorine, tellurium, thallium and mercury.

3. The photovoltaic device described in claim 2 wherein the dopant is present in amounts less than about 20,000 parts per million.

4. The photovoltaic cell described in claim 1 wherein the P-type selenium layer is less than about 50 microns thick.

5. The photovoltaic cell described in claim 4 wherein the P-type selenium layer is between about 3 and 50 microns thick.

6. The photovoltaic cell as described in claim 1 wherein the N-type layer is a mixture of N-type cadmium selenide and N+ type cadmium oxide with the oxygen content varying from substantially zero at the P-N junction to about 50 atomic % at the outer surface of the N-type layer.

7. The photovoltaic cell as described in claim 1 wherein the N-type layer is between about 20 A and 1000 A thick.

8. A photovoltaic device which comprises a metallic base electrode, the metal being at least one metal selected from the group consisting of iron, nickel, cobalt, aluminum and alloys thereof; a continuous, crystalline P-type selenium layer less than about 50 microns thick; a tellurium layer between about 50 A and 10,000 A thick interposed between the base electrode and the selenium layer and forming an ohmic contact therebetween; an N-type cadmium selenide layer less than about 1000 A thick contiguous with the selenium layer and forming a photovoltaic heterojunction therebetween; an N+ type cadmium oxide layer less than about 1000 A thick in ohmic contact with the cadmium selenide layer; and a metallic current collecting electrode in grid form on the cadmium oxide layer which maximizes transmission of incident light through the N+ and N-type layers to the heterojunction while minimizing the resistance between fingers of the grid whereby conversion of sunlight to electrical energy is maximized.

* * * * *